(12) United States Patent
Yamamoto

(10) Patent No.: US 9,827,593 B2
(45) Date of Patent: Nov. 28, 2017

(54) ULTRASONIC MOTOR

(71) Applicant: CANON KABUSHIKI KAISHA, Tokyo (JP)

(72) Inventor: Harushige Yamamoto, Yamato (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 374 days.

(21) Appl. No.: 14/548,755

(22) Filed: Nov. 20, 2014

(65) Prior Publication Data

US 2015/0183001 A1 Jul. 2, 2015

(30) Foreign Application Priority Data

Dec. 27, 2013 (JP) ................................. 2013-272337

(51) Int. Cl.
*H01L 41/053* (2006.01)
*B06B 1/06* (2006.01)
(Continued)

(52) U.S. Cl.
CPC .............. *B06B 1/0644* (2013.01); *G02B 7/08* (2013.01); *H01L 41/0536* (2013.01); *H02N 2/0055* (2013.01); *H02N 2/026* (2013.01)

(58) Field of Classification Search
CPC ..... B06B 1/0644; G02B 7/08; H01L 41/0536; H02N 2/0055; H02N 2/026; H02N 2/103
(Continued)

(56) References Cited

U.S. PATENT DOCUMENTS 7,999,439 B2* 8/2011 Sakamoto .............. H02N 2/026
310/323.01
8,314,533 B2* 11/2012 Higashionji .......... H01L 41/053
310/323.02
(Continued)

FOREIGN PATENT DOCUMENTS

CN 103296920 A 9/2013
EP 2680334 A1 1/2014
(Continued)

OTHER PUBLICATIONS

English Translation of JP 2008187756.*
(Continued)

*Primary Examiner* — Bryan Gordon
(74) *Attorney, Agent, or Firm* — Carter, DeLuca, Farrell & Schmidt, LLP

(57) ABSTRACT

There is disclosed an ultrasonic motor having a vibrator that vibrates by a high frequency drive voltage applied thereto, a sliding member that comes in contact frictionally with the vibrator, pressurizing means for pressurizing the vibrator to the sliding member, a base to which the vibrator is fixed, a vibrator support member holding the base, and coupling means for coupling the vibrator with the vibrator support member, the vibrator and the sliding member being relatively moved by the vibration, wherein the coupling means includes the base, the rolling member that freely moves the base to the vibrator support member in a pressurizing direction of the pressurizing means, and an urging member that urges the rolling member in a direction perpendicular to the pressurizing direction of the pressurizing means.

16 Claims, 3 Drawing Sheets

(51) Int. Cl.
*H02N 2/00* (2006.01)
*H02N 2/02* (2006.01)
*G02B 7/08* (2006.01)

(58) Field of Classification Search
USPC .................. 310/323.09, 323.14, 323.02
See application file for complete search history.

(56) References Cited

U.S. PATENT DOCUMENTS

| | | | |
|---|---|---|---|
| 2003/0117040 A1* | 6/2003 | Komoda | H02N 2/0045 310/323.02 |
| 2005/0230208 A1 | 10/2005 | Ochiai et al. | |
| 2010/0133955 A1* | 6/2010 | Sakamoto | H02N 2/04 310/323.02 |
| 2011/0241487 A1 | 10/2011 | Mukae et al. | |
| 2013/0330153 A1 | 12/2013 | Nishimura et al. | |
| 2014/0246955 A1 | 9/2014 | Rosenkranz | |
| 2014/0306578 A1* | 10/2014 | Oda | H02N 2/163 310/323.02 |

FOREIGN PATENT DOCUMENTS

| | | |
|---|---|---|
| JP | H10-090584 A | 4/1998 |
| JP | 2001-292584 A | 10/2001 |
| JP | 2008-187756 A | 8/2008 |
| JP | 2008-199700 A | 8/2008 |
| JP | 2013-179733 A | 9/2013 |
| WO | 2013/034146 A2 | 3/2013 |

OTHER PUBLICATIONS

English Translation of JP 2013179733.*
Japanese Office Action issued in corresponding application No. 2013272337 dated Nov. 10, 2015.
Chinese Office Action issued in corresponding application No. 201410826655.4 on Jun. 27, 2016.
European Search Report issued in corresponding application No. 14194944.6 on May 29, 2015.
Japanese Office Action issued in corresponding application No. 2016135727 dated Oct. 3, 2017, with English translation, 6 pages.

* cited by examiner

ULTRASONIC MOTOR

BACKGROUND OF THE INVENTION

Field of the Invention

The present invention relates to a motor which is applied to an optical device or the like. More particularly, it relates to an ultrasonic motor which is applied to the optical device or the like.

Description of the Related Art

Heretofore, in this type of ultrasonic motor, a vibrator that periodically vibrates by application of a high frequency voltage is brought into contact under pressure with a sliding member to drive the sliding member.

However, in a related art described in Japanese Patent Application Laid-open No. 2001-292584, one spring member 17 and a plurality of rubber sheets 15, 16 and 18 are provided with a function of supporting a vibration node portion of a vibrating body 14 (corresponding to a vibrator of the present invention) and a function of pressurizing the vibrating body to generate a friction force between the vibrating body and a rail 11a (corresponding to a sliding member of the present invention), and for this purpose, the spring member 17 is interposed between a fixing plate 19 and the vibrating body 14 via the respective rubber sheets. Therefore, for example, when an impact force is applied due to vibration, dropdown or the like, relative positions of the fixing plate and a vibrating plate disadvantageously deviate, which causes the problem that a position of the rail 11a cannot correctly be controlled.

To solve the problem, an object of the present invention is to hold a vibrator without causing any rattle in a moving direction, thereby improving a feeding accuracy of a vibrator support member.

SUMMARY OF THE INVENTION

To achieve the above object, according to the present invention, there is provided a motor having a vibrator that vibrates by a high frequency drive voltage applied thereto, a sliding member that comes in contact frictionally with the vibrator, pressurizing means for pressurizing the vibrator to the sliding member, a base to which the vibrator is fixed, a vibrator support member holding the base, and coupling means for coupling the vibrator with the vibrator support member, the vibrator and the sliding member being relatively moved by the vibration, wherein the coupling means includes the base, a rolling member that freely moves the base to the vibrator support member in a pressurizing direction of the pressurizing means, and an urging member that urges the rolling member in a direction perpendicular to the pressurizing direction of the pressurizing means.

According to the present invention, the base to which the vibrator is fixed and the vibrator support member are relatively held with a flexibility in the pressurizing direction and without any rattle in a moving direction, to hold the vibrator without causing any rattle in the moving direction, so that a feeding accuracy of the vibrator support member can be improved.

Further features of the present invention will become apparent from the following description of exemplary embodiments with reference to the attached drawings.

DESCRIPTION OF THE EMBODIMENTS

Figure 1:
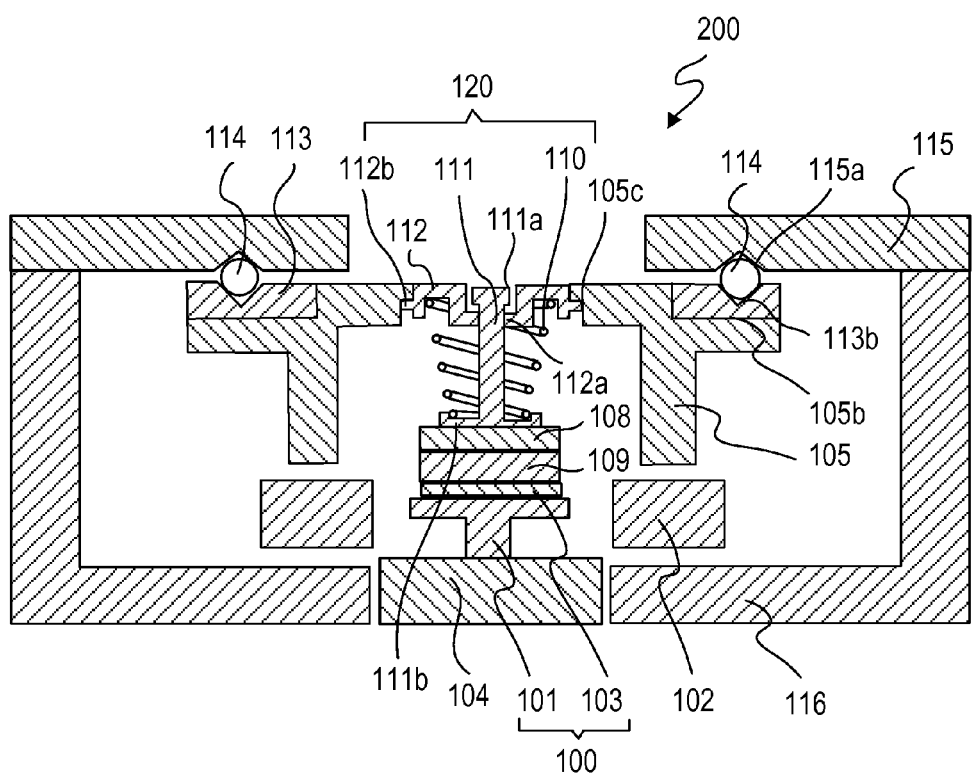
FIG. 1 is a sectional view of a main part of an ultrasonic motor according to an embodiment of the present invention.

Preferred embodiments of the present invention will now be described in detail in accordance with the accompanying drawings. In the drawings, the same part is denoted with the same symbol.

Figure 2:
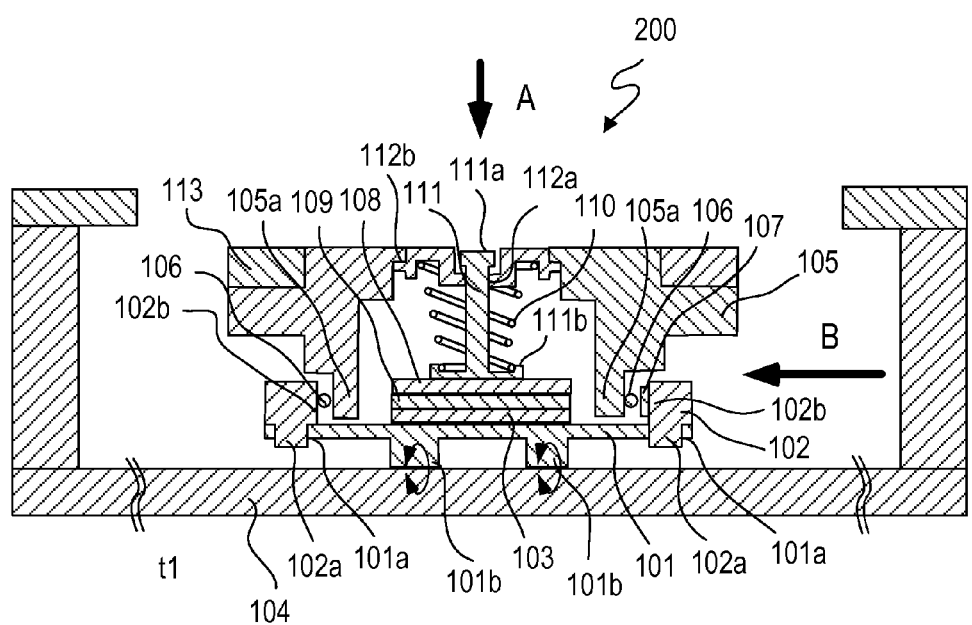
FIG. 2 is a sectional view of the main part of the ultrasonic motor according to the embodiment of the present invention in a moving direction.

FIG. 1 is a sectional view of a main part of an ultrasonic motor showing an embodiment of the present invention (showing a perpendicular cross section in a drive direction), and FIG. 2 is a sectional view of the main part of the ultrasonic motor showing the embodiment of the present invention in a moving direction. Furthermore, the present embodiment will be described on the basis of a direct acting type (linear type) of ultrasonic motor as an example, but the present embodiment is also applicable to another type such as a rotary type.

An ultrasonic motor 200 includes a vibrating plate 101. The vibrating plate 101 includes portions 101a to be joined. The portions 101a to be joined are fixed to joining convex portions 102a of a base 102 by bonding or the like (see FIG. 2). The base 102 is constituted of a square frame body, and made of a resin or a metal having a thickness larger than that of the vibrating plate 101.

Furthermore, a piezoelectric element 103 is secured to the vibrating plate 101 by an adhesive or the like. The vibrating plate 101 is set to cause resonance in each of a longitudinal direction and a short direction, when a high frequency voltage is applied to the piezoelectric element 103. It is to be noted that the vibrating plate 101 and the piezoelectric element 103 constitute a vibrator 100. The vibrator 100 is constituted to cause an ultrasonic vibration when a high frequency drive voltage is applied thereto.

As a result, in FIG. 2, tips of pressure contact portions 101b formed on the vibrating plate 101 causes such an elliptic motion as shown in FIG. 2. When a frequency or a phase of the high frequency voltage to be applied to the piezoelectric element 103 is changed, a rotating direction or an ellipse ratio can suitably be changed to generate a desirable motion. In consequence, the vibrating plate comes in contact frictionally with a slider 104 as a sliding member which is a counterpart, thereby producing a drive force to relatively move the slider, so that the vibrator 100 itself can be driven along an optical axis (a sheet surface perpendicular direction in FIG. 1, i.e., a right-left direction in FIG. 2) which is the moving direction. The slider 104 is fixed to an after-mentioned unit support member 116 by fastening means (screws).

In FIG. 1 and FIG. 2, a vibrator support member 105 is coupled with the base 102 to which the vibrator 100 is fixed, by coupling means as follows. In FIG. 2, two rollers 106 which are rolling members are disposed on both sides via the pressure contact portions 101b of the vibrating plate 101. This is, the cylindrical rollers 106 which are the rolling members are disposed in two front and rear portions of the vibrator 100 in the moving direction.

As shown in FIG. 2, the vibrator support member 105 has two extending portions 105a formed to extend downward, and the rollers 106 and a leaf spring 107 are incorporated in a space formed by coupling portions 102b of the base 102 and the extending portions 105a. The leaf spring 107 which is an urging member having a predetermined elasticity abuts on the coupling portion 102b of the base 102, and the roller 106 is sandwiched between the leaf spring 107 and the extending portion 105a, and is movable in a pressurizing direction.

The leaf spring 107 is incorporated together with one of the rollers 106 in the right space in FIG. 2. By an urging force of the leaf spring 107 in the incorporated state, the vibrator support member 105 is urged in the left direction in FIG. 2 via one (on the right side in FIG. 2) of the rollers 106 and the base 102 is urged in the right direction in FIG. 2.

At this time, the urging force is applied in a direction B (see FIG. 2) perpendicular to a pressurizing direction A of the vibrator as described later. As a result, in the same manner as described above, the other roller 106 positioned on the left side in FIG. 2 and incorporated in the other incorporating space is also sandwiched between the other extending portion 105a as the coupling protrusion of the vibrator support member 105 and the other coupling portion 102b of the base 102.

According to the abovementioned constitution, it is possible to realize the coupling means in which any rattle is not caused in the moving direction (the right-left direction in FIG. 2) and a sliding resistance is hardly generated in the after-mentioned pressurizing direction A (an upward-downward direction in FIG. 2) by an operation of the roller.

Figure 3:
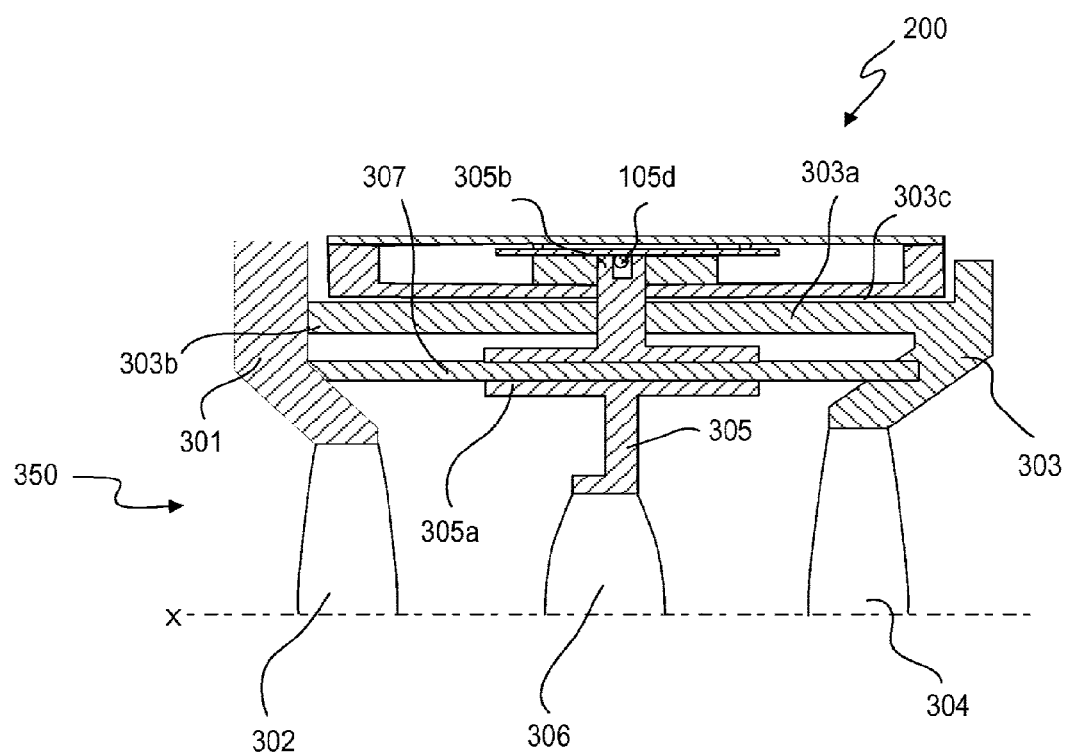
FIG. 3 is a sectional view of the main part showing a state where the ultrasonic motor according to the embodiment of the present invention is incorporated in a lens barrel section of an optical device.

At this time, the urging force of the leaf spring 107 is set to a value larger than an inertial force due to acceleration and deceleration that takes place at the start and the stop of operations of the vibrator support member 105 and an after-mentioned section to be driven (see 305 and 306 in FIG. 3). By this setting, the base 102, the vibrator 100 and the vibrator support member 105 can stably realize drive control without generation of a relative displacement in the moving direction due to the inertial force during driving.

A pressurizing plate 108 sandwiches an elastic member 109 between the pressurizing plate and the piezoelectric element 103 as described later, and is constituted to press and hold the piezoelectric element 103 with a flexibility.

A pressurizing spring 110 is interposed between a spring holding member 111 and a spring ground plate 112, and constituted as a pressurizing spring unit. At this time, a large diameter portion 111a disposed at a tip of the spring holding member 111 is loosely fitted into a fitting portion 112a of the spring ground plate 112, and hence a unit state can be maintained against a spring force of the pressurizing spring 110 after assembling.

On an outer diameter portion of the spring ground plate 112, bayonet protrusions 112b are formed in several portions in a circumferential direction. In this incorporated state, positions of the bayonet protrusions 112b in the pressurizing direction A are defined by a bayonet engaging portion 105c formed in the vibrator support member 105. At this time, a pressing portion 111b disposed at the tip of the spring holding member 111 produces a pressurizing force to press the vibrator 100 onto the slider 104 via the pressurizing plate 108 and the elastic member 109 by the urging force of the spring 110. Therefore, the vibrator 100 can come in contact frictionally with the slider 104. It is to be noted that the pressurizing spring 110, the spring holding member 111 and the spring ground plate 112 constitute pressurizing means 120.

A movable plate 113 constituting a part of a guide member is fixed to an abutment portion 105b of the vibrator support member 105 by bonding or screwing. In the movable plate 113, groove portions 113b having a V-shaped cross section are formed, into which balls 114 are fitted to guide the vibrator support member 105 in an optical axis direction (see FIG. 1). A cover plate 115 is fixed to the unit support member 116 by known screws.

The cover plate 115 also constitutes a part of the above-mentioned guide section, and the balls 114 are held by groove portions 115a having a V-shaped cross section and disposed at positions facing the groove portions 113b of the movable plate 113. Therefore, it is possible to support the vibrator support member 105 so that the member can move forward and backward along the moving direction (a sheet surface vertical direction in FIG. 1, i.e., a sheet surface right-left direction in FIG. 2). According to the abovementioned constitution, the direct acting type ultrasonic motor of the embodiment of the present invention is completed.

Each of the cross sections of the groove portion 113b and the groove portion 115a sandwiching the ball 114 therebetween has the V-shape in a direction perpendicular to a driving direction of the vibrator support member 105. However, the groove portion 113b and the groove portion 115a can be formed in another shape, so that each cross section can be formed into a U-shape.

FIG. 3 is a sectional view of a main part showing a behavior when the ultrasonic motor 200 of the embodiment of the present invention is incorporated in a lens barrel section 350 of an optical device. A first lens holding member 301 holds a first lens 302, and a third lens holding member 303 holds a third lens 304. In an outer peripheral portion of the third lens holding member 303, a tubular portion 303a is disposed, and fastened to the first lens holding member 301 in a tip portion 303b by unshown screws.

In a part of an outer diameter portion of the tubular portion 303a, a unit receiving portion 303c to which the ultrasonic motor 200 is fixed is disposed, and detachably fixed by screws. Furthermore, in an inner diameter portion of the tubular portion 303a, a second lens holding member 305 holding a second lens 306 is disposed. The second lens 306 moves as a focusing lens of the optical device along an optical axis X (see FIG. 3) by the ultrasonic motor 200 according to the embodiment of the present invention.

At this time, the second lens holding member 305 is disposed so that a guide bar 307 is relatively slidably fitted into a shaft bearing 305a, and hence the second lens 306 can move along the optical axis X. The second lens holding member 305 is coupled with the vibrator support member 105 by, for example, engagement of an engaging pin 105d disposed in the vibrator support member 105 with an engagement concave portion 305b disposed in the second lens holding member 305. However, the coupling can be performed by a known rack and the engaging pin.

As described above, the vibrator support member 105 is coupled with the base 102 to which the vibrator 100 is fixed, via the rollers 106 and the leaf spring 107. Therefore, the vibrator 100 and the base 102 can be held to the vibrator support member 105 in the pressurizing direction A of the pressurizing means 120 by a rolling operation without substantially losing the pressurizing force. Furthermore, the vibrator 100 and the base 102 are held in the moving direction by the operation of the leaf spring 107 without causing any rattle. In consequence, the second lens 306 which is the focusing lens of the optical device can accurately be driven and controlled along a direction of the optical axis X.

The specific examples of the ultrasonic motor according to the embodiment of the present invention and the lens barrel section of the optical device incorporating the motor have been described above in detail, but the present invention is not limited to the above embodiment, and any configuration can be taken without departing from the gist of the following claims. In the present embodiment, the leaf spring 107 is used as the urging member to urge the rollers 106, but an urging member other than the leaf spring can be used as long as the member can impart the urging force required to prevent the rattle from being caused.

Furthermore, needless to say, the constitution of the present invention is applicable not only to the ultrasonic motor described in the above embodiment but also to a motor that allows the vibrator to perform a vibration other than the ultrasonic vibration.

The present invention is used to accurately execute drive control of an optical device.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-272337, filed Dec. 27, 2013, which is hereby incorporated by reference herein in its entirety.

What is claimed is:

1. A motor comprising:
   a vibrator that is configured to vibrate when a high frequency drive voltage is applied thereto;
   a sliding member that comes in contact frictionally with the vibrator;
   a pressurizing means for pressurizing the vibrator to the sliding member;
   a base to which the vibrator is fixed;
   a vibrator support member holding the base; and
   a coupling means for coupling the base with the vibrator support member, the vibrator and the sliding member being relatively moved by the vibration,
   wherein the coupling means comprises a first rolling member and a second rolling member that freely move the base to the vibrator support member in a pressurizing direction of the pressurizing means, and an urging member that urges one of the first rolling member and the second rolling member in a direction perpendicular to the pressurizing direction of the pressurizing means,
   wherein the first rolling member and the second rolling member are disposed in a position between the base and the vibrator support member, and
   wherein the vibrator is disposed in a position between the first rolling member and the second rolling member in a relative moving direction of the vibrator and the sliding member.

2. The motor according to claim 1, wherein the coupling means comprises extending portions extending from the vibrator support member in the pressurizing direction, and the first rolling member and the second rolling member are disposed in a space formed between the extending portions and the base.

3. The motor according to claim 1, wherein an urging force of the urging member is set to a value larger than an inertial force to be applied to the base or the vibrator support member when the vibrator is moved by the vibration.

4. The motor according to claim 2, wherein the urging member abuts on the base, and one of the first rolling member and the second rolling member is sandwiched between the urging member and the extending portion.

5. The motor according to claim 1, wherein the urging member is a leaf spring.

6. The motor according to claim 1, wherein the first rolling member and the second rolling member are cylindrical rollers.

7. The motor according to claim 1, wherein the motor is an ultrasonic motor, and
   wherein the vibrator is configured to perform an ultrasonic vibration when the high frequency drive voltage is applied thereto.

8. A motor comprising:
   a vibrator that is configured to vibrate when a high frequency drive voltage is applied thereto;
   a sliding member that comes in contact frictionally with the vibrator;
   a pressurizing member for pressurizing the vibrator to the sliding member;
   a base to which the vibrator is fixed;
   a vibrator support member holding the base; and
   a coupling member for coupling the base with the vibrator support member, the vibrator and the sliding member being relatively moved by the vibration,
   wherein the coupling member comprises a first rolling member and a second rolling member that freely moves the base to the vibrator support member in a pressurizing direction of the pressurizing member, and an urging member that urges one of the first rolling member and the second rolling member in a direction perpendicular to the pressurizing direction of the pressurizing member,
   wherein the first rolling member and the second rolling member are disposed in a position between the base and the vibrator support member, and
   wherein the vibrator is disposed in a position between the first rolling member and the second rolling member in a relative moving direction of the vibrator and the sliding member.

9. The motor according to claim 8, wherein the coupling member comprises an extending portion extending from the vibrator support member in the pressurizing direction, and the first rolling member and the second rolling member are disposed in a space formed between the extending portion of the base.

10. The motor according to claim 8, wherein an urging force of the urging member is set to a value larger than an inertial force to be applied to the base or the vibrator support member when the vibrator is moved by the vibration.

11. The motor according to claim 9, wherein the urging member abuts on the base and one of the first rolling member and the second rolling member is sandwiched between the urging member and the extending portion.

12. The motor according to claim 8, wherein the urging member is a leaf spring.

13. The motor according to claim 8, wherein the first rolling member and the second rolling member are cylindrical rollers.

14. The motor according to claim 8, wherein the motor is an ultrasonic motor, and
   wherein the vibrator is configured to perform an ultrasonic vibration when the high frequency drive voltage is applied thereto.

15. The motor according to claim 1, wherein the vibrator is linearly moved by the vibration.

16. The motor according to claim 8, wherein the vibrator is linearly moved by the vibration.

* * * * *